United States Patent
Akaike et al.

(10) Patent No.: US 9,147,798 B2
(45) Date of Patent: Sep. 29, 2015

(54) SEMICONDUCTOR LIGHT EMITTING ELEMENT AND METHOD FOR MANUFACTURING SAME

(75) Inventors: Yasuhiko Akaike, Fukuoka-ken (JP); Yoshinori Natsume, Kanagawa-ken (JP); Shinji Nunotani, Tokyo (JP); Kazuyoshi Furukawa, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

(21) Appl. No.: 13/421,402

(22) Filed: Mar. 15, 2012

(65) Prior Publication Data
US 2012/0305964 A1    Dec. 6, 2012

(30) Foreign Application Priority Data

May 31, 2011 (JP) ................................ 2011-121623

(51) Int. Cl.
*H01L 33/38* (2010.01)
*H01L 33/00* (2010.01)
*H01L 33/40* (2010.01)

(52) U.S. Cl.
CPC .......... *H01L 33/0079* (2013.01); *H01L 33/405* (2013.01); *H01L 33/38* (2013.01); *H01L 33/40* (2013.01)

(58) Field of Classification Search
CPC ....... H01L 33/46; H01L 33/38; H01L 33/405; H01L 33/60; H01L 33/54
USPC .................... 257/98, 88, 99, 13, 79, E31.127, 257/E33.006, 81
See application file for complete search history.

(56) References Cited

U.S. PATENT DOCUMENTS 4,170,460 A * 10/1979 Donley ......................... 65/30.13
6,794,690 B2 * 9/2004 Uemura ......................... 257/183
(Continued)

FOREIGN PATENT DOCUMENTS

JP    58-215056    12/1983
JP    5-343401    12/1993
(Continued)

OTHER PUBLICATIONS

Japanese Office Action issued Apr. 1, 2014, in Japan Patent Application No. 2011-121623 (with English translation).
(Continued)

*Primary Examiner* — Zandra Smith
*Assistant Examiner* — Jaehwan Oh
(74) *Attorney, Agent, or Firm* — Oblon, McClelland, Maier & Neustadt, L.L.P.

(57) ABSTRACT

According to one embodiment, a semiconductor light emitting element includes a light emitting element includes a semiconductor stacked body including a light emitting layer, a reflection layer, a support substrate, a first bonding electrode and a second bonding electrode. The reflection layer is made of a metal and has a first surface and a second surface opposite to the first surface. The semiconductor stacked body is provided on a side of the first surface of the reflection layer. The first bonding electrode is provided between the second surface and the support substrate and includes a convex portion projected toward the support substrate and a bottom portion provided around the convex portion in plan view. The second bonding electrode includes a concave portion fitted in the convex portion of the first bonding electrode and is capable of bonding the support substrate and the first bonding electrode.

10 Claims, 10 Drawing Sheets

(56) References Cited

U.S. PATENT DOCUMENTS

| | | | |
|---|---|---|---|
| 7,646,036 B2* | 1/2010 | Kozawa et al. | 257/99 |
| 7,659,553 B2* | 2/2010 | Kato et al. | 257/98 |
| 7,813,402 B2* | 10/2010 | Sekiguchi | 372/46.01 |
| 7,863,061 B2* | 1/2011 | Ikuta et al. | 438/21 |
| 7,880,180 B2* | 2/2011 | Tada et al. | 257/88 |
| 7,982,236 B2* | 7/2011 | Sano et al. | 257/99 |
| 8,068,529 B2* | 11/2011 | Ikuta et al. | 372/46.01 |
| 8,237,183 B2* | 8/2012 | Yasuda et al. | 257/98 |
| 8,385,381 B2* | 2/2013 | Maeda et al. | 372/50.124 |
| 8,421,085 B2* | 4/2013 | Katsuno et al. | 257/76 |
| 8,426,878 B2* | 4/2013 | Yasuda et al. | 257/91 |
| 8,446,446 B2* | 5/2013 | Hoshi et al. | 347/238 |
| 8,736,652 B2* | 5/2014 | Harasaka et al. | 347/238 |
| 2003/0124769 A1* | 7/2003 | Dotta et al. | 438/108 |
| 2004/0079967 A1* | 4/2004 | Shakuda et al. | 257/200 |
| 2006/0104853 A1* | 5/2006 | Tauchi et al. | 420/501 |
| 2007/0014324 A1* | 1/2007 | Maeda et al. | 372/46.01 |
| 2007/0290215 A1* | 12/2007 | Kato et al. | 257/79 |
| 2008/0185609 A1* | 8/2008 | Kozawa et al. | 257/99 |
| 2009/0045425 A1* | 2/2009 | Yasuda et al. | 257/98 |
| 2009/0050916 A1* | 2/2009 | Katsuno et al. | 257/98 |
| 2010/0065870 A1* | 3/2010 | Arai et al. | 257/98 |
| 2010/0203659 A1* | 8/2010 | Akaike et al. | 438/29 |
| 2010/0219436 A1* | 9/2010 | Watanabe | 257/98 |
| 2011/0018024 A1* | 1/2011 | Fukshima et al. | 257/98 |
| 2011/0042680 A1* | 2/2011 | Akaike et al. | 257/76 |
| 2011/0198660 A1* | 8/2011 | Bae et al. | 257/99 |
| 2012/0105991 A1* | 5/2012 | Saito et al. | 359/885 |
| 2012/0305890 A1* | 12/2012 | Aihara et al. | 257/13 |

FOREIGN PATENT DOCUMENTS

| | | |
|---|---|---|
| JP | 2000-7513 | 1/2000 |
| JP | 2007-173530 | 7/2007 |
| JP | 2007-335793 | 12/2007 |
| JP | 2008-192782 | 8/2008 |
| JP | 2009-200178 | 9/2009 |
| JP | 2010-278112 | 12/2010 |
| WO | WO 2012/008322 A1 | 1/2012 |

OTHER PUBLICATIONS

Office Action mailed Sep. 2, 2014 in Japanese Application No. 2011-121623 filed May 31, 2011 (w/English translation).

Office Action mailed Mar. 19, 2015 in Japanese Application No. 2011-121623 filed May 31, 2011 (w/English translation).

* cited by examiner

SEMICONDUCTOR LIGHT EMITTING ELEMENT AND METHOD FOR MANUFACTURING SAME

CROSS-REFERENCE TO RELATED APPLICATIONS

This application is based upon and claims the benefit of priority from the prior Japanese Patent Application No.2011-121623, filed on May 31, 2011; the entire contents of which are incorporated herein by reference.

FIELD

Embodiments described herein relate generally to a semiconductor light emitting element and a method for manufacturing same.

BACKGROUND

For light emitting elements used in e.g. illumination devices, display devices, and traffic signals, there is an increasing demand for higher brightness.

A metal reflection layer can be provided below the light emitting layer. Then, the emission light directed downward from the light emitting layer is reflected. This increases the upward light extraction efficiency and facilitates increasing the brightness. In this case, for instance, a silicon (Si) substrate can be wafer bonded to a semiconductor substrate including the light emitting layer. Then, the crystal growth substrate can be removed to form a thin film multilayer light emitting element. This facilitates increasing the volume productivity.

The reflectance of a metal film decreases as the wavelength of visible light becomes shorter. In particular, the light reflectance of a stable electrode metal such as Au, Pt, and Pd decreases to 60% or less at 450 nm. This makes it difficult to achieve high light extraction efficiency.

In contrast, the light reflectance of Ag and Al can be made as high as 90% or more at 450 nm. However, Ag and Al are prone to migration and cause the problem of decreased reliability.

DETAILED DESCRIPTION

In general, according to one embodiment, a light emitting element includes a semiconductor stacked body including a light emitting layer, a reflection layer, a support substrate, a first bonding electrode and a second bonding electrode. The reflection layer is made of a metal and has a first surface and a second surface opposite to the first surface. The semiconductor stacked body is provided on a side of the first surface of the reflection layer. The first bonding electrode is provided between the second surface and the support substrate and includes a convex portion projected toward the support substrate and a bottom portion provided around the convex portion in plan view. The second bonding electrode includes a concave portion fitted in the convex portion of the first bonding electrode and is capable of bonding the support substrate and the first bonding electrode.

Embodiments of the invention will now be described with reference to the drawings.

Figure 1A:
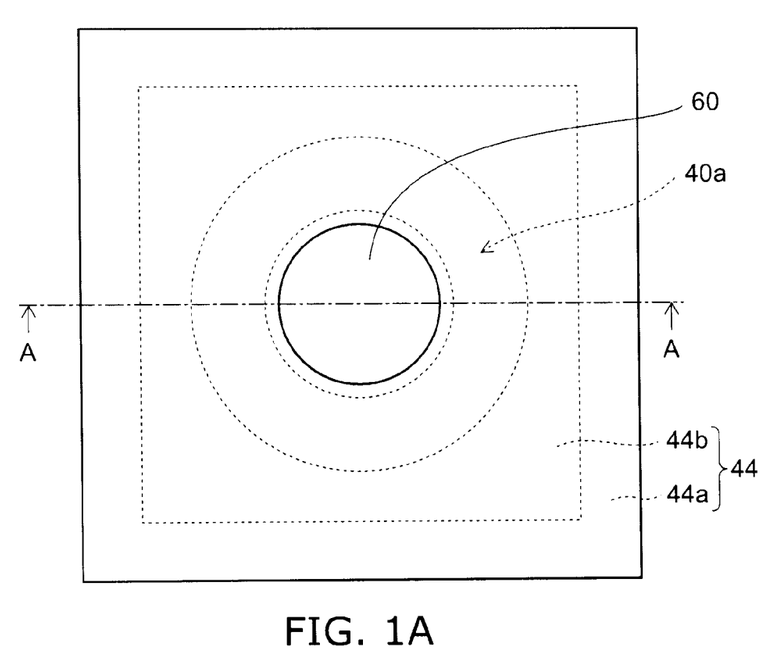
FIG. 1A is a schematic plan view of a semiconductor light emitting element according to a first embodiment.
Figure 1B:
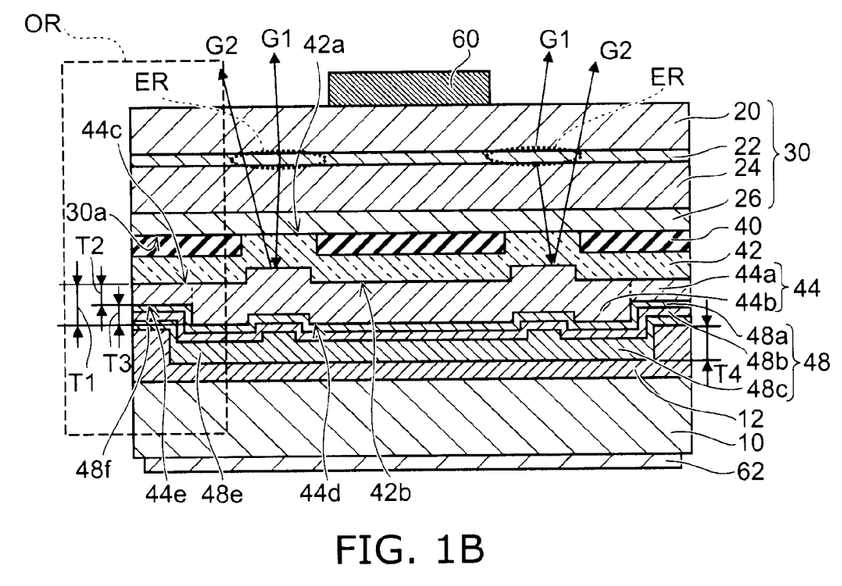
FIG. 1B is a schematic sectional view taken along line A-A.

FIG. 1A is a schematic plan view of a semiconductor light emitting element according to a first embodiment. FIG. 1B is a schematic sectional view taken along line A-A.

The semiconductor light emitting element includes a semiconductor stacked body 30 including a light emitting layer 22 capable of emitting emission light, a reflection layer 44 provided on a first surface 30a side of the semiconductor stacked body 30, a first bonding electrode 48, a support substrate 10 made of e.g. conductive Si or Ge, and a second bonding electrode 12 provided on the support substrate 10. Between the semiconductor stacked body 30 and the reflection layer 44, a transparent conductive film 42 may be provided.

The semiconductor stacked body 30 includes an InGaAlP-based material represented by the composition formula $In_x(Ga_yAl_{1-y})_{1-x}P$ (where $0 \le x \le 1$, $0 \le y \le 1$) or an AlGaAs-based material represented by the composition formula $Al_xGa_{1-x}As$ ($0 \le x \le 0.6$).

The reflection layer 44 includes an interior region 44b provided at the center and an exterior region 44a provided around the interior region 44b in plan view. In this example, the exterior region 44a is provided so as to surround the interior region 44b in plan view. The thickness T2 (after alloying) of the exterior region 44a is smaller than the thickness T1 (after alloying) of the interior region 44b. The first surface 44c of the reflection layer 44 reflects emission light. The second surface 44d opposite to the first surface 44c of the reflection layer 44 has a step difference T3 (=T1−T2) between the exterior region 44a and the interior region 44b.

If the semiconductor stacked body 30 is in direct contact with the reflection layer 44 made of Au or Ag, an alloy layer may be formed and increase the optical loss. If a transparent conductive film 42 is provided between the semiconductor stacked body 30 and the reflection layer 44, an alloy layer is less likely to be formed between the semiconductor stacked body 30 and the transparent conductive film 42. Thus, the optical loss can be reduced, and hence this is more preferable.

The first bonding electrode 48 is provided so as to cover the step difference T3 of the second surface 44d of the reflection layer 44. That is, the first bonding electrode 48 includes a convex portion 48e provided on the interior region 44b of the reflection layer 44, and a bottom portion 48f provided on the exterior region 44a around the interior region 44b. As a result, a step difference T4 occurs in the first bonding electrode 48. The second bonding electrode 12 can be made of a metal solder material. By melting the metal solder material, the first bonding electrode 48 can be bonded to the support substrate 10 while filling the step difference T4 of the first bonding electrode 48. That is, the second bonding electrode 12 includes a concave portion fitted in the convex portion 48e of the first bonding electrode 48. By the solidification of the metal solder material, the adhesive strength between the wafers can be increased. Here, a second electrode 62 is provided on the back surface of the conductive support substrate 10.

Consider the case where the semiconductor stacked body 30 is made of an InGaAlP-based material. In this case, the light emitting layer 22 can emit light in the wavelength range from green to red. In FIG. 1B, the semiconductor stacked body 30 includes, from the transparent conductive film 42 side, a contact layer 26 of the second conductivity type, a second layer 24 of the second conductivity type, a light emitting layer 22, and a first layer 20 of the first conductivity type in this order. Furthermore, on the surface of the contact layer 26 made of e.g. GaP, an insulating layer 40 having an opening 40a and made of e.g. $SiO_2$ or $Si_3N_4$ may be provided. Then, the current is blocked by the insulating layer 40, and flows through the opening 40a between the first electrode 60 and the first bonding electrode 48. Thus, the light emitting region ER above the opening 40a emits light. For instance, the light G1 directed upward from the light emitting region ER, and the light G2 directed downward from the light emitting region ER and reflected by the reflection layer 44, can be extracted upward.

The second bonding electrode 12 can be made of a metal solder material provided on the support substrate 10. Alternatively, on the surface of the support substrate 10, for instance, Ti/Pt/Au or Cr/Au may be provided, and the second bonding electrode 12 may be provided thereon. The melted metal solder material bonds the first bonding electrode 48 to the support substrate 10 while filling the step difference T4. In the case where the surface of the second bonding electrode 12 is made of Au, the surface of the first bonding electrode 48 can also be made of Au. Then, by application of heat and pressure, they can be bonded also in the thermocompression mode. Here, in FIG. 1B, the interior region 44b is rectangular. However, the shape is not limited thereto, but may be e.g. circular.

FIGS. 2A to 2F are process sectional views of a method for manufacturing a semiconductor light emitting element according to the first embodiment.

FIGS. 2A to 2F show the end portion OR (dashed line) in FIG. 1B. In the schematic view of FIG. 2A, on a crystal growth substrate 50, a semiconductor stacked body 30 is formed. Here, the crystal growth substrate 50 is made of GaAs. However, the invention is not limited thereto. The semiconductor stacked body 30 includes, from the crystal growth substrate 50 side, a first layer 20 of the first conductivity type, a light emitting layer 22, a second layer 24 of the second conductivity type, and a contact layer 26 made of GaP of the second conductivity type having low optical loss. The first layer 20 and the second layer 24 can include cladding layers for sandwiching the light emitting layer 22 on both sides to confine light in the vertical direction. On the contact layer 26, an insulating layer 40 made of e.g. $SiO_2$ or $Si_3N_4$ is formed.

Figure 2A:
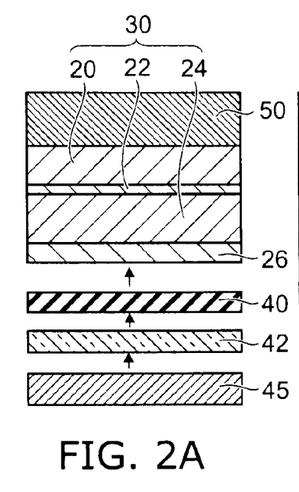
FIGS. 2A to 2F are process sectional views of a method for manufacturing a semiconductor light emitting element according to the first embodiment.

The thickness of the insulating layer 40 is preferably in the range of e.g. 50-200 nm. The insulating layer 40 is provided with an opening, although not shown in the end portion OR. A transparent conductive film 42 made of e.g. ITO (indium tin oxide), zinc oxide, or tin oxide is provided so as to cover the insulating layer 40 and the contact layer 26 exposed in its opening. The transparent conductive film 42 absorbs part of visible light. Hence, the transparent conductive film 42 is preferably made as thin as e.g. 50-200 nm to the extent that alloying between the semiconductor stacked body 30 and the reflection layer 44 can be suppressed.

On the second surface 42b of the transparent conductive film 42, a first film 45 made of a first metal is formed. The first metal is e.g. Ag, Ag alloy, or Al. The thickness of the first film 45 is preferably made thin, such as in the range of 50-400 nm, to the extent that the reflectance can be kept high.

Figure 2B:
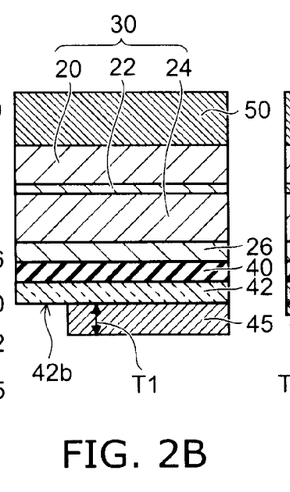

In the schematic view of FIG. 2B, the first film 45 is patterned using a photoresist. In the case of Ag, for instance, a wet etching method with phosphoric acid or a dry etching method can be used.

Figure 2C:
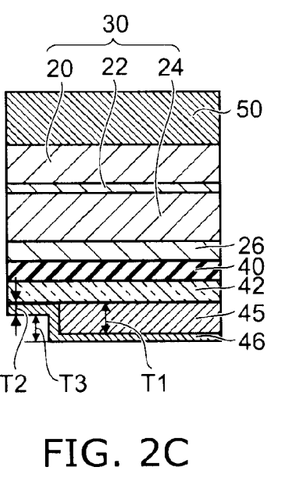

In the schematic view of FIG. 2C, a second film 46 made of a second metal is formed so as to cover the upper surface of the patterned first film 45 and the region of the transparent conductive film 42 where the first film 45 has been removed. The second metal is Au, but may also be made of e.g. Pd or Pt. The contact strength between the second film 46 and the transparent conductive film 42 can be made higher than the contact strength between the first film 45 and the transparent conductive film 42. This facilitates keeping high adhesive strength required for e.g. the dicing process.

Figure 2D:
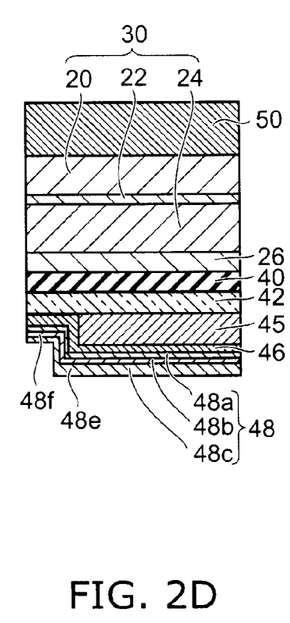

In the schematic view of FIG. 2D, on the second film 46, a first bonding electrode 48 is formed. The first bonding electrode 48 includes, e.g. from the second film 46 side, a barrier metal such as titanium (Ti) 48a and platinum (Pt) 48b, and a metal such as gold (Au) 48c in this order. As the barrier metal, for instance, tungsten/nickel (W/Ni) can also be used. The first bonding electrode 48 does not need a patterning process. This can simplify the manufacturing process. More specifically, the number of times of the photolithography process and patterning process can be reduced, and a manufacturing method with high productivity can be realized. The first bonding electrode 48 includes a convex portion 48e on the interior region 44b, and a bottom portion 48f on the exterior region 44a.

On the other hand, on a support substrate 10, a second bonding electrode 12 made of e.g. a metal solder material is formed. The metal solder material can be e.g. a eutectic such as AuIn, AuSn (eutectic temperature being approximately 280° C.), AuGe (eutectic temperature being approximately 350° C.), AuSi (eutectic temperature being approximately 380° C.), or In. Its thickness can be set to e.g. 1-5 μm.

Figure 2E:
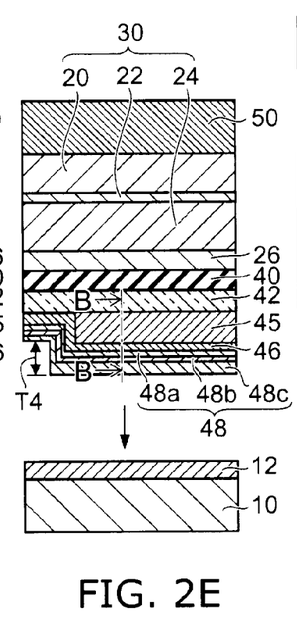

As shown in the schematic view of FIG. 2E, the first bonding electrode 48 and the second bonding electrode 12 are stacked and pressurized, and heated to higher than or equal to the melting point of the metal solder material. The melting point of the metal solder material can be set to within the temperature range of e.g. 150-400° C. depending on its material. The melted metal solder material fills the step difference T4 of the first bonding electrode 48 to provide gapless wafer bonding. This can increase the adhesive strength between the support substrate 10 and the semiconductor stacked body 30. Here, the step difference T4 is measured between the surface of the convex portion 48e and the surface of the bottom portion 48f near the outer edge portion.

Furthermore, depending on the temperature of the heat treatment of the wafer bonding process, alloying may easily proceed from the neighborhood of the interface between the first film 45 and the second film 46. By varying the temperature and time of the heat treatment process, the composition ratio of alloying can be controlled. As a result, the bonding strength between the first film 45 and the second film 46 can be increased. Here, the transparent conductive film 42 side of the interior region 44b is constituted by the first film 45. Hence, despite alloying, the light reflectance of the interior region 44b can be easily made higher than the light reflectance of the exterior region 44a.

Figure 3A:
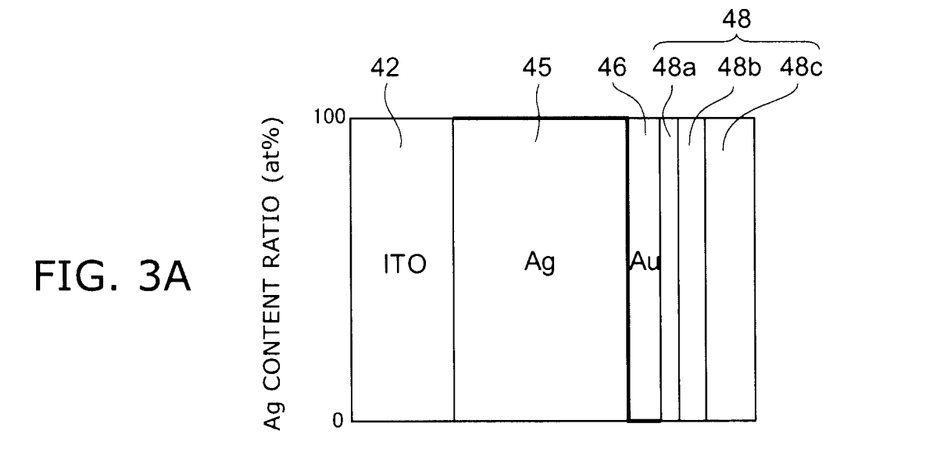
FIG. 3A is a graph showing the distribution of Ag content ratio of the reflection layer before heat treatment.
Figure 3B:
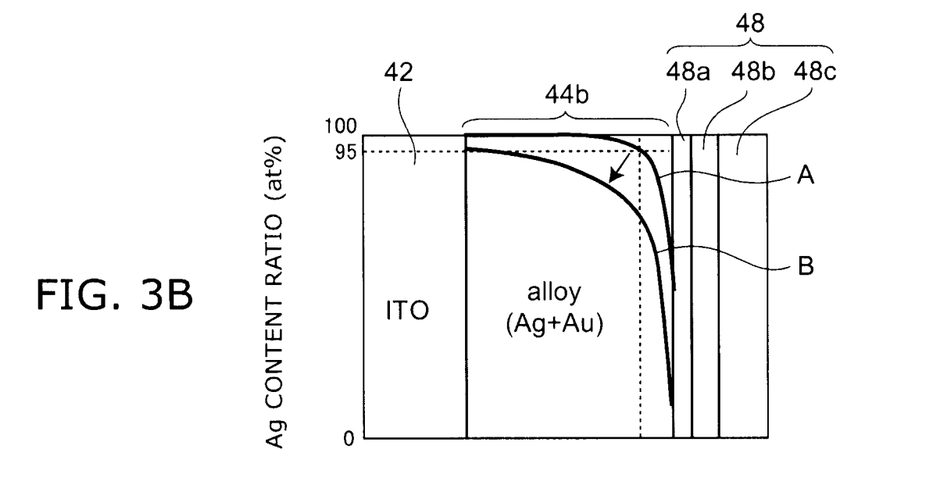
FIG. 3B is a graph showing the distribution of Ag content ratio of the reflection layer after heat treatment.

FIG. 3A is a graph showing the distribution of Ag content ratio of the reflection layer before heat treatment. FIG. 3B is a graph showing the distribution of Ag content ratio of the reflection layer after heat treatment.

The vertical axis represents the Ag content ratio (at %, percentage in the number of atoms) of the interior region 44b. The horizontal axis represents position in the wafer depth direction. Here, the heat treatment process may be either a wafer bonding process or another process.

FIG. 3A shows the distribution of Ag content ratio in the wafer depth direction along line B-B of FIG. 2E. Before heat treatment, the first film 45 is made of 100% Ag, and the second film 46 is made of 0% Ag. FIG. 3B shows the distribution of Ag content ratio along line B-B of FIG. 2F. After heat treatment, Ag and Au interdiffuse, and alloying proceeds as shown by curve A to curve B. The thickness of the first film (Ag) 45 is larger than the thickness of the second film (Au) 46. Hence, Ag easily penetrates into Au. Conversely, Au also penetrates into Ag. However, on the side in contact with the transparent conductive film 42, the Ag content ratio is set to remain 95% or more. Here, in FIG. 1A, even if the width of the exterior region 44a is made sufficiently smaller than the width of the interior region 44b, migration of Ag can be suppressed.

In an experiment by the inventors, the thickness of the first film 45 made of Ag was set to approximately 20 times the thickness of the second film 46 made of Au. By the melted metal solder material, wafer bonding was performed at 350° C. In this case, the Ag content ratio of the interior region 44b in contact with the transparent conductive film 42 was successfully made 95 at % or more. As a result, it has turned out that for the light reflectance on the transparent conductive film 42 side of the interior region 44b, the decrease from the light reflectance of Ag can be set to 2% or less. That is, for instance, the thickness of the first film 45 made of Ag can be set to approximately 200 nm, and the thickness of the second film 46 made of Au can be set to approximately 10 nm.

Into the exterior region 44a, Ag is diffused primarily laterally to form an alloy layer. Even after alloying by diffusion of Ag, the light reflectance of the exterior region 44a, which was an Au film before alloying, is lower than the light reflectance of the interior region 44b at the surface in contact with the transparent conductive film 42.

Figure 2F:
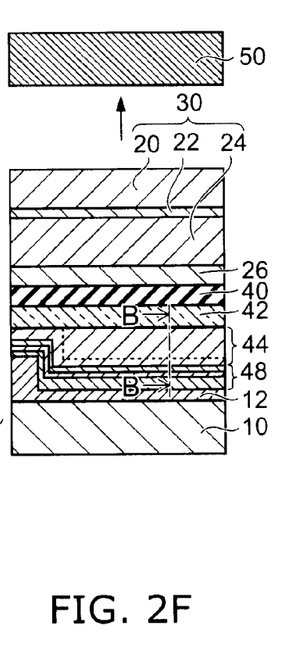

Finally, as shown in the schematic view of FIG. 2F, the crystal growth substrate 50 is removed. In this case, for instance, a mixed solution of ammonia and hydrogen peroxide can be used. However, the removal process is not limited thereto.

Subsequently, along a dicing line set above the exterior region 44a, a process for separation into chips is performed. This can prevent the first metal from being exposed at the side surface of the chip. Thus, short circuit of the pn junction due to migration of e.g. Ag, and the sulfurization of Ag, for instance, can be suppressed. Hence, the reliability can be improved.

Figure 4:
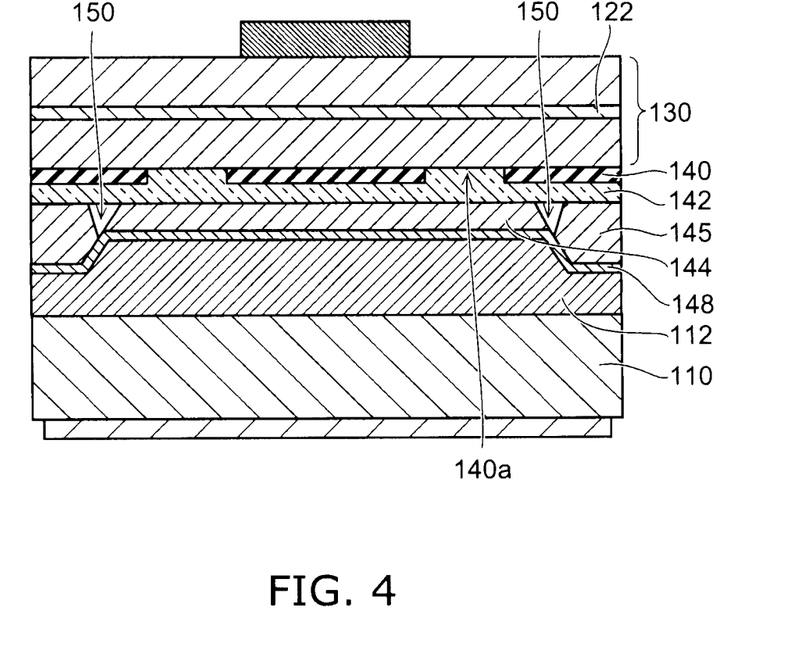
FIG. 4 is a schematic sectional view of a semiconductor light emitting element according to a comparative example.

FIG. 4 is a schematic sectional view of a semiconductor light emitting element according to a comparative example.

The semiconductor stacked body 130 includes a light emitting layer 122 and is made of an InAlGaP-based material. Below the semiconductor stacked body 130, an insulating film 140 is provided. In an opening 140a provided in the insulating film 140, the semiconductor stacked body 130 is in contact with a transparent conductive film 142. On the central region of the lower surface of the transparent conductive film 142, an Ag film 144 is provided. Furthermore, on the lower surface of the transparent conductive film 142 in the exterior region, an Au film 145 thicker than the Ag film 144 is provided. A bonding electrode 112 made of a barrier metal such as Ti and Pt is provided so as to cover the surface of the Ag film 144 and the surface of the Au film 145. The Si substrate 110 and the bonding electrode 112 are bonded with an AuIn-based alloy solder.

The reflectance of Ag and Al is higher than that of Au. Hence, the emission light directed downward from the light emitting region above the opening 140a is efficiently reflected upward. However, Ag and Al are prone to migration. Hence, if Ag or Al extends to the end surface of the element, Ag particles having migrated causes e.g. short circuit of the pn junction. The thick Au film 145 can suppress this migration of Ag. However, the process for patterning the Ag film 144 and the process for patterning the Au film 145 are each needed. Thus, on the lower surface of the transparent conductive film 142, a gap 150 is likely to occur at the boundary between the Ag film 144 and the Au film 145. Compared with Au and the like, the adhesive strength of Ag or Ag alloy with the transparent conductive film 142 is not sufficient. Thus, from the neighborhood of the gap 150, peeling of the Ag film 144 is likely to occur.

In contrast, in the first embodiment, as shown in FIG. 2C, the second film 46 is provided so as to gaplessly cover the front surface and side surface of the first film 45 and the surface of the transparent conductive film 42. Thus, while suppressing the peeling of the first film 45, migration of Ag to the chip side surface can be suppressed. Furthermore, in the first embodiment, the process for patterning the second film 46 is not needed. Moreover, the second film 46 and the first bonding electrode 48 can be formed by a continuous process. This can reduce the number of times of the metal film formation process.

FIGS. 5A to 5E are process sectional views of a method for manufacturing a semiconductor light emitting element according to a variation of the first embodiment.

Figure 5A:
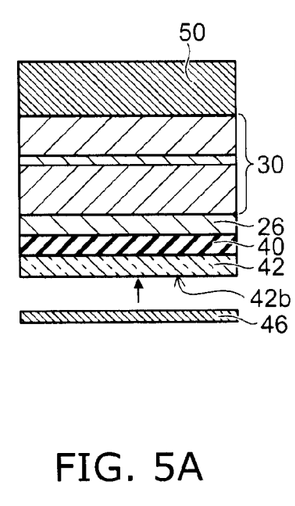
FIGS. 5A to 5E are process sectional views of a method for manufacturing a semiconductor light emitting element according to a variation of the first embodiment.

In the schematic view of FIG. 5A, on the contact layer 26 of the semiconductor stacked body 30, an insulating layer 40 made of e.g. $SiO_2$ or SiN and a transparent conductive film 42 made of e.g. ITO are formed in this order. The thickness of the insulating layer 40 is preferably in the range of e.g. 50-200 nm. The transparent conductive film 42 is preferably made as thin as e.g. 50-200 nm. Furthermore, on the second surface 42b of the transparent conductive film 42, a second film 46 made of Au is formed.

Figure 5B:
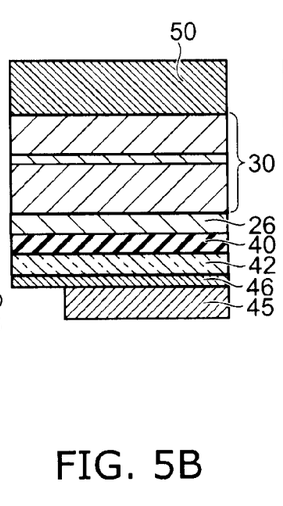

In FIG. 5B, on the second film 46, a first film 45 made of Ag is formed and patterned. The thickness of the first film 45 is preferably made thin, such as in the range of 50-400 nm, to the extent that the reflectance can be kept high.

Figure 5C:
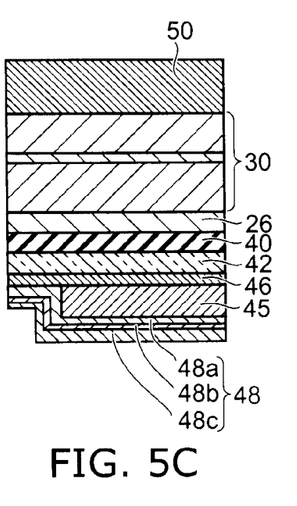

As shown in the schematic view of FIG. 5C, a first bonding electrode 48 is formed so as to cover the upper surface of the patterned first film 45 and the second film 46 exposed at the region where the first film 45 has been removed. The first bonding electrode 48 includes, e.g. from the second film 46 side, a barrier metal such as Ti/Pt, and a metal such as Au in this order.

Figure 5D:
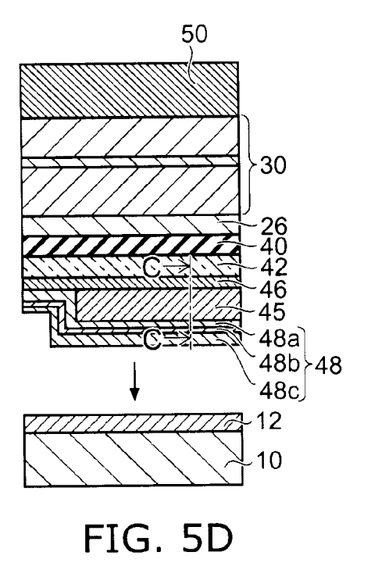

As shown in the schematic view of FIG. 5D, the first bonding electrode 48 and the second bonding electrode 12 are stacked and pressurized, and heated to higher than or equal to the melting point of the metal solder material. The melted metal solder material provides wafer bonding while filling the step difference so as not to produce a gap between the first bonding electrode 48 and the support substrate 10.

Figure 5E:
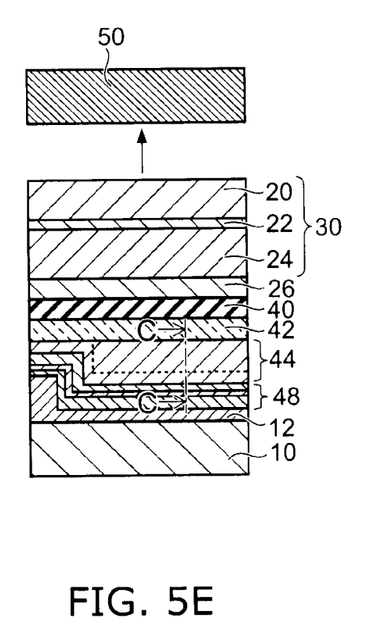

Finally, as shown in the schematic view of FIG. 5E, the crystal growth substrate 50 is removed. In this case, for instance, a mixed solution of ammonia and hydrogen peroxide can be used. However, the removal process is not limited thereto. If the wafer bonding temperature is near 350° C., the interfacial region between the second film 46 and the first film 45 is alloyed. That is, a reflection layer 44 made of an alloy layer of Au and Ag is formed. In this case, the transparent conductive film 42 side of the interior region 44b is constituted by the second film 46. Thus, the composition ratio of the first metal having high light reflectance is increased by heat treatment so that the light reflectance of the interior region 44b is made higher than the light reflectance of the exterior region 44a.

The reflection layer 44 includes an interior region 44b having a large thickness and an exterior region 44a around the interior region 44b. The reflection layer 44 reflects the emission light upward. In this variation, the side surface of the first film 45 is surrounded with the second film 46 and the first bonding electrode 48. This suppresses peeling and migration of the first film 45 made of Ag.

Figure 6A:
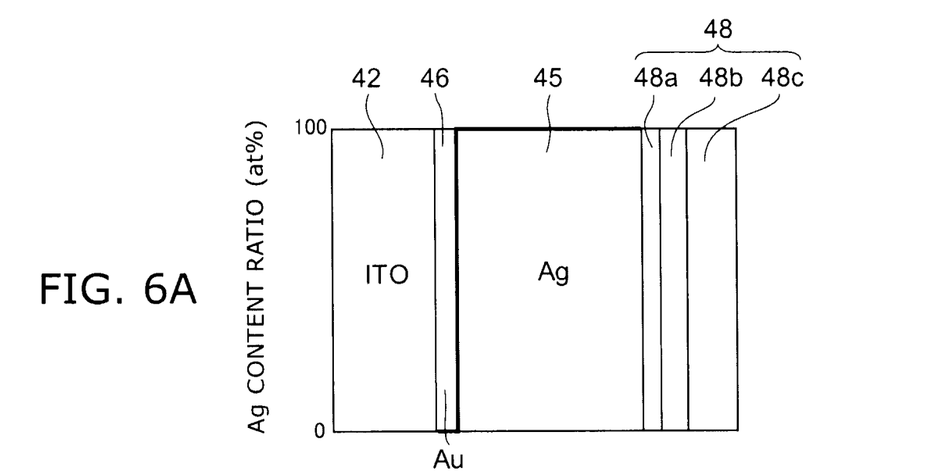
FIG. 6A is a graph showing the distribution of Ag content ratio of the reflection layer 44 before heat treatment of the semiconductor light emitting element according to the variation.
Figure 6B:
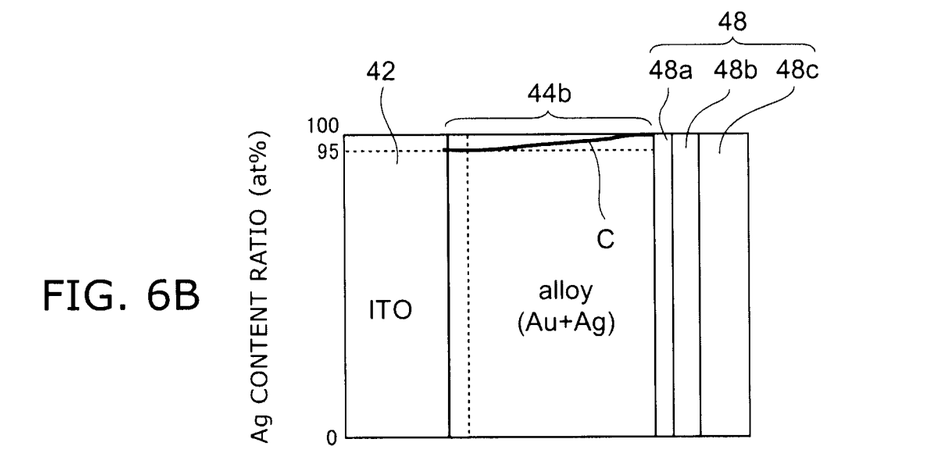
FIG. 6B is a graph showing the distribution of Ag content ratio of the reflection layer 44 after heat treatment.

FIG. 6A is a graph showing the distribution of Ag content ratio of the reflection layer 44 before heat treatment of the semiconductor light emitting element according to the variation. FIG. 6B is a graph showing the distribution of Ag content ratio of the reflection layer 44 after heat treatment.

FIG. 6A shows the distribution of Ag content ratio in the wafer depth direction along line C-C of FIG. 5D. Before heat treatment, the second film 46 is provided in contact with the transparent conductive film 42. FIG. 6B shows the distribution of Ag content ratio along line C-C of FIG. 5E. After heat treatment, Ag is diffused into thin Au. This increases the Ag content ratio of the interior region 44b on the transparent conductive film 42 side. By varying the heat treatment temperature and time, the Ag content ratio at the surface in contact with the transparent conductive film 42 is set to 95 at % or more. That is, the Ag content ratio becomes higher toward the first bonding electrode 48. Furthermore, into the exterior region 44a, Ag is diffused primarily laterally to form an alloy layer. The light reflectance of the exterior region 44a, which was an Au film before alloying, can be made lower than the light reflectance of the interior region 44b at the surface in contact with the transparent conductive film 42.

Figure 7:
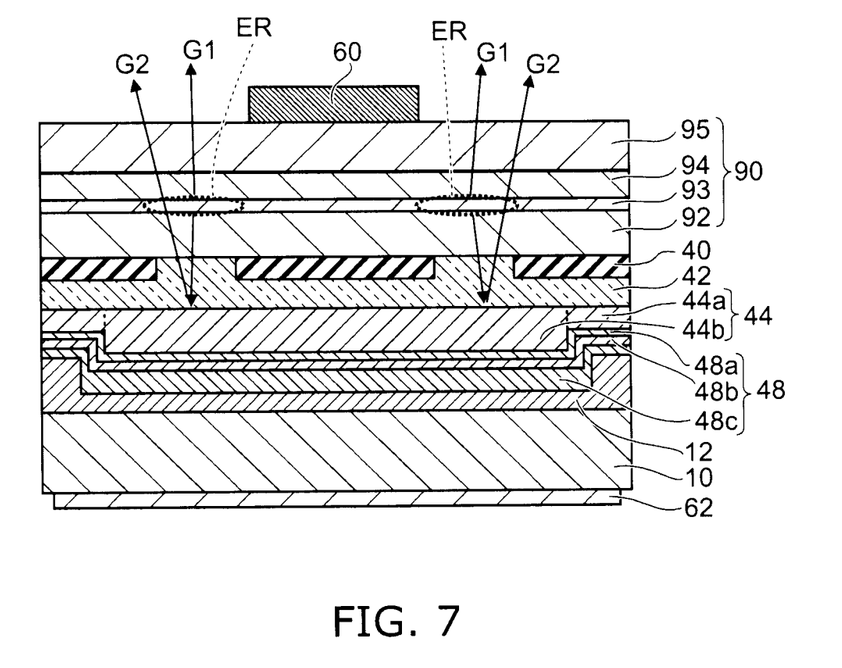
FIG. 7 is a schematic sectional view of a semiconductor light emitting element according to a second embodiment.

FIG. 7 is a schematic sectional view of a semiconductor light emitting element according to a second embodiment.

The semiconductor stacked body 90 is made of a nitride-based material represented by the composition formula $In_xGa_yAl_{1-x-y}N$ (where $1 \leq x \leq 1$, $x+y \leq 1$). Its emission light is set in the wavelength range from ultraviolet to green. The stacked body 90 includes a second cladding layer 92 made of e.g. $Al_{0.2}Ga_{0.8}N$, a light emitting layer 93 provided on the second cladding layer 92, a first cladding layer 94 provided on the light emitting layer 93 and made of e.g. $Al_{0.2}Ga_{0.8}N$ of the first conductivity type, and a current spreading layer 95 of the first conductivity type provided on the first cladding layer 94. The cross-sectional structure of the semiconductor stacked body 90 is not limited thereto, but may include e.g. a contact layer and a light guide layer. As shown in FIG. 7, the light G1 directed upward from the light emitting region ER, and the light G2 directed downward from the light emitting region ER and reflected by the reflection layer 44, can be extracted upward.

Figure 8:
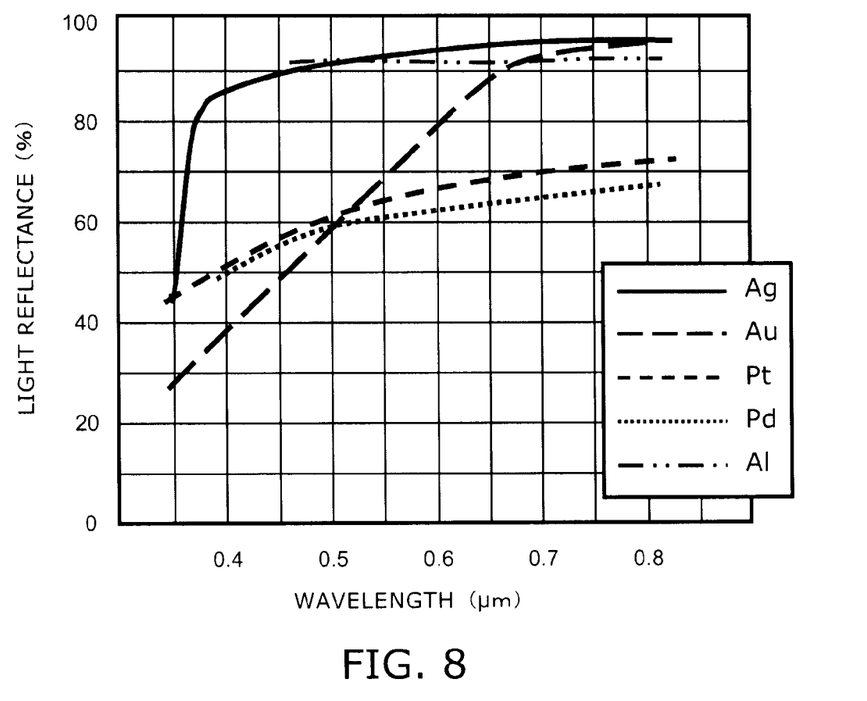
FIG. 8 is a graph showing the dependence of the reflectance of metals on the wavelength.

FIG. 8 is a graph showing the dependence of the reflectance of metals on the wavelength.

The vertical axis represents the light reflectance of metals (%). The horizontal axis represents the wavelength of incident light (μm). In the short wavelength range such as blue light, the light reflectance of the metal may decrease. As shown in FIG. 8, the reflectance of Ag and Al is as high as 90% or more in the wavelength range of 450 nm or more. On the other hand, at 450 nm, the reflectance of Au is as low as approximately 48%, and the reflectance of Pt is as low as approximately 57%. That is, preferably, the metal reflection layer provided inside the semiconductor light emitting element for emitting light in the wavelength range from blue to green includes e.g. Ag, Ag alloy, or Al.

Also in the second embodiment, in the reflection layer 44 including Ag and Au, the interior region 44b is configured to include Ag at high proportion. The Ag content ratio of the exterior region 44a around the interior region 44b is made lower than the Ag content ratio of the interior region 44b. Then, at 450 nm, the reflectance in the region having high light emission intensity can be set to the reflectance of Ag, i.e., near 90%, and the reflectance in the exterior region having low light emission intensity can be set to approximately 50%. That is, if the width WO of the exterior region 44a is set to e.g. 10 μm, then a reflection layer having high reflectance can be achieved while suppressing migration of Ag to the end surface and keeping close contact.

Figure 9:
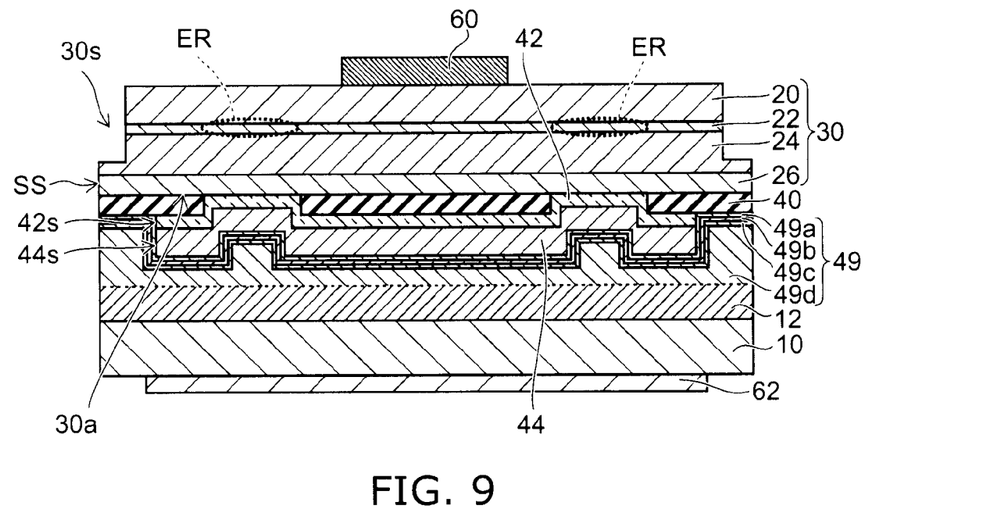
FIG. 9 is a schematic sectional view of a semiconductor light emitting element according to a third embodiment.

FIG. 9 is a schematic sectional view of a semiconductor light emitting element according to a third embodiment.

The semiconductor light emitting element includes a semiconductor stacked body 30 including a light emitting layer 22 capable of emitting emission light, a reflection layer 44 provided on a first surface 30a side of the semiconductor stacked body 30, a first bonding electrode 48, a support substrate 10 made of e.g. conductive Si or Ge, and a second bonding electrode 12 provided on the support substrate 10.

The reflection layer 44 is smaller than the semiconductor stacked body 30 in plan view. That is, the outer edge 44s of the reflection layer 44 is located inside the side surface SS of the semiconductor light emitting element. On the outer edge 44s and surface of the reflection layer 44, a first bonding electrode 49 is provided. The first bonding electrode 49 includes e.g. titanium (Ti) 49a, platinum (Pt) 49b, and titanium (Ti) 49c. The first bonding electrode 49 may further include a metal solder material 49d. In the case where the reflection layer 44 includes e.g. Ag, Ag is not exposed at the side surface SS. Hence, its migration and sulfurization can be suppressed.

Furthermore, as shown in this figure, between the semiconductor stacked body 30 and the reflection layer 44, a transparent conductive film 42 may be provided. In this case, the outer edge 42s of the transparent conductive film 42 is located inside the side surface SS. That is, near the side surface SS, the adhesive strength between the first bonding electrode 49 and the insulating layer 40 is easily made higher than the adhesive strength between the first bonding electrode and the transparent conductive film 42. Thus, advantageously, high adhesive strength is achieved in e.g. the dicing process.

FIGS. 10A to 10F are process sectional views of a method for manufacturing a semiconductor light emitting element according to the third embodiment.

Figure 10A:
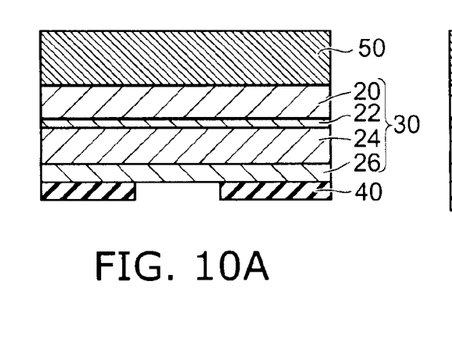
FIGS. 10A to 10F are process sectional views of a method for manufacturing a semiconductor light emitting element according to the third embodiment.

FIGS. 10A to 10F show half the size of the semiconductor element in the cross section of the wafer. In FIG. 10A, on a crystal growth substrate 50, a semiconductor stacked body 30 is formed. Here, the crystal growth substrate 50 is made of GaAs. The semiconductor stacked body 30 includes, from the crystal growth substrate 50 side, a first layer 20 of the first conductivity type, a light emitting layer 22, a second layer 24 of the second conductivity type, and a contact layer 26 made of GaP of the second conductivity type having low optical loss. The first layer 20 and the second layer 24 can include cladding layers for sandwiching the light emitting layer 22 on both sides to confine light in the vertical direction. On the contact layer 26, an insulating layer 40 made of e.g. $SiO_2$ or $Si_3N_4$ is formed.

Figure 10B:
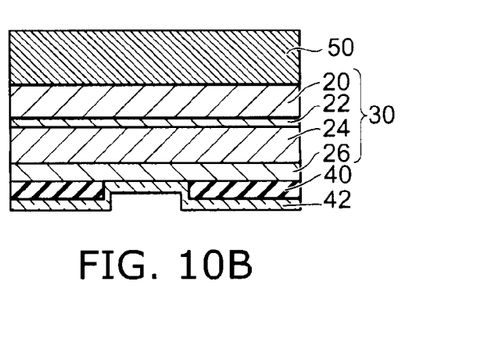

The thickness of the insulating layer 40 is set to e.g. 50 nm. The insulating layer 40 is provided with an opening. As shown in FIG. 10B, a transparent conductive film 42 is provided so as to cover the insulating layer 40 and the contact layer 26 exposed in its opening. The transparent conductive film 42 is set to e.g. 60 nm. On the second surface 42b of the transparent conductive film 42, a reflection layer 44 made of e.g. an Ag alloy layer (e.g., a thickness of 200 nm) is formed.

Figure 10C:
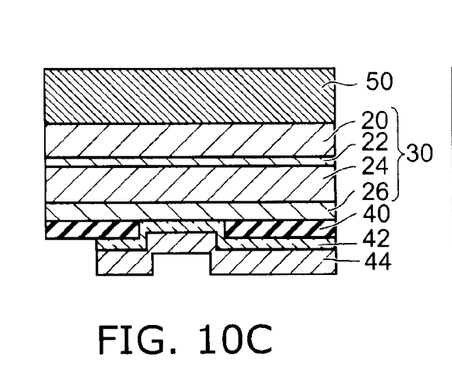

As shown in FIG. 10C, the reflection layer 44 and the transparent conductive film 42 near the side surface of the chip (near the dicing line) are removed.

Figure 10D:
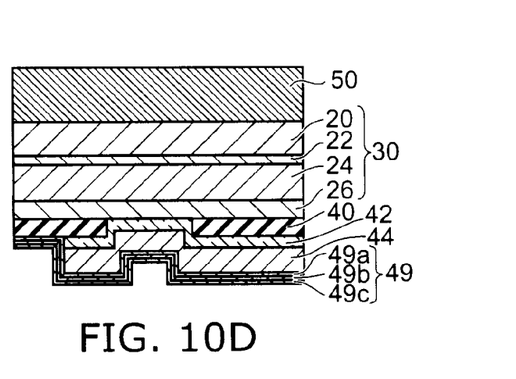

Next, as shown in FIG. 10D, on the insulating layer 40 exposed by the removal of the reflection layer 44 and the transparent conductive film 42 and on the reflection layer 44, a first bonding electrode 49 is formed. The first bonding electrode 49 includes e.g. titanium 49a, platinum 49b, titanium 49c, and a metal solder material 49d made of e.g. AuIn. The first bonding electrode 49 includes a convex portion 49e on the reflection layer 44, and a bottom portion 49f on the insulating layer 40.

Figure 10E:
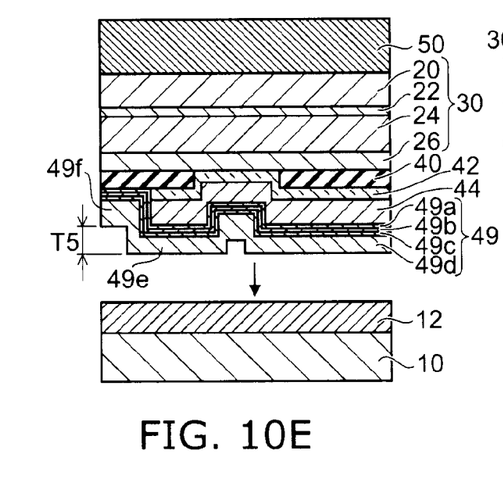

As a result, as shown in FIG. 10E, the first bonding electrode 49 includes the convex portion 49e on the reflection layer 44, and the bottom portion 49f on the insulating layer 40, and produces a step difference T5. On the other hand, on a support substrate 10, a second bonding electrode 12 made of a metal solder material made of e.g. AuIn is formed. Furthermore, the first bonding electrode 49 and the second bonding electrode 12 are stacked and pressurized, and heated to higher than or equal to the melting point of the solder material. The melted solder material fills the step difference T5 of the first bonding electrode 49 to provide gapless wafer bonding. This can increase the adhesive strength between the support substrate 10 and the semiconductor stacked body 30. If the first bonding electrode 49 and the second bonding electrode 12 include a solder material, then after they melt into each other, the boundary (dashed line) is not left clearly. Here, even if only the second bonding electrode 12 includes a solder material, the step difference T5 can be filled.

Figure 10F:
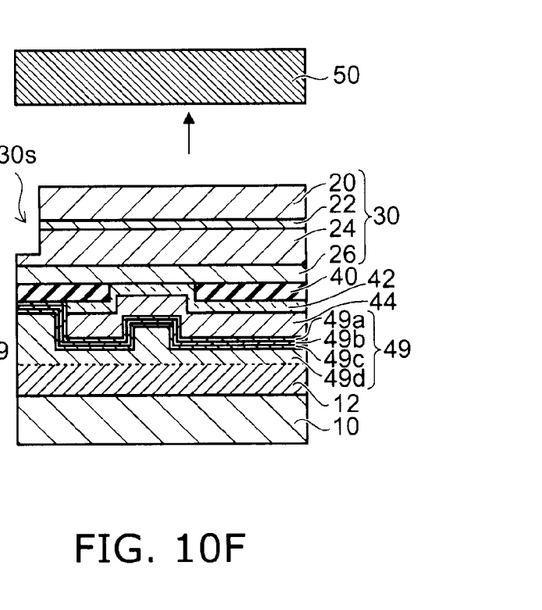

Next, as shown in FIG. 10F, the crystal growth substrate 50 is removed. A first electrode 60 and a second electrode 62 are formed. Subsequently, a trench 30s is formed in the region serving as a dicing line. Blade dicing, for instance, is performed on the trench 30s for separation into chips.

Figure 11:
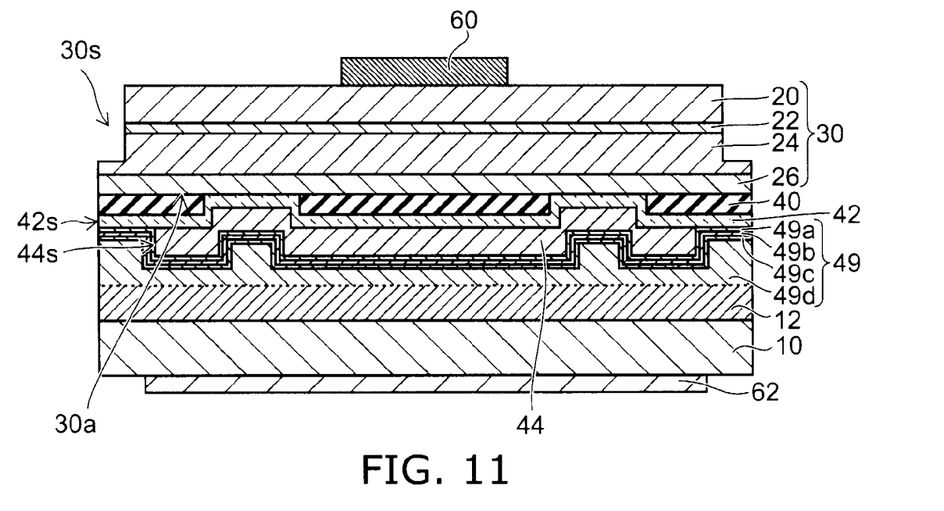
FIG. 11 is a schematic sectional view of a variation according to the third embodiment.

FIG. 11 is a schematic sectional view of a variation according to the third embodiment.

The outer edge 42s of the transparent conductive film 42 may be exposed at the side surface SS. A step difference may occur in the region serving as a dicing line. However, the second bonding electrode 12 includes a solder material. Hence, the melted solder material fills the step difference T5 and suppresses the occurrence of a cavity.

Figure 12:
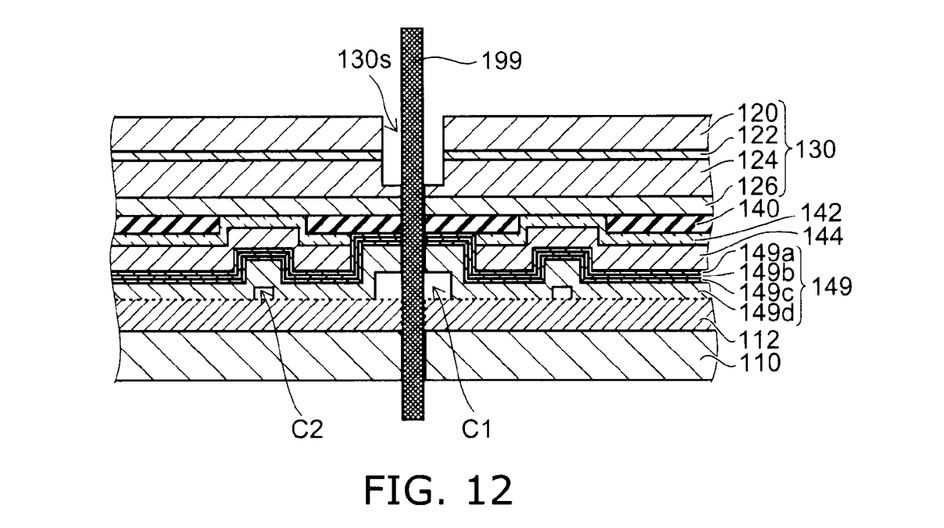
FIG. 12 is a schematic sectional view of a semiconductor light emitting element wafer according to a comparative example.

FIG. 12 is a schematic sectional view of a semiconductor light emitting element wafer according to a comparative example.

Along the dicing line, a trench 130s formed by e.g. scribing is provided. Near the dicing line, the reflection layer and the transparent conductive film are not provided. At the side surface after separation into chips, the reflection layer and the transparent conductive film are not exposed. In the comparative example in which neither the first bonding electrode 149 nor the second bonding electrode 112 includes a solder material, the step difference is not filled, and cavities C1, C2 occur below the dicing line after wafer bonding. Among them, if the cavity C1 occurs, then in e.g. the dicing process for cutting by rotating a blade 99, cracking, chipping and the like of the chip are likely to occur near the cavity C1. In contrast, in the semiconductor light emitting element according to the third embodiment, no cavity occurs near the dicing line. Thus, cracking and chipping of the chip can be suppressed.

In the semiconductor light emitting element according to the first to third embodiments, the adhesive strength of the multilayer including the support substrate 10, the reflection layer 44, and the semiconductor stacked body 30 is increased. Thus, the brightness can be increased while keeping high reliability. Furthermore, the process for forming the bonding electrode is simplified, and a manufacturing method with higher productivity can be achieved. The semiconductor light emitting element according to the present embodiments can be widely used in e.g. illumination devices, display devices, and traffic signals.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting element comprising:
   a semiconductor stacked body including a light emitting layer;
   a reflection layer having a first surface and a second surface opposite to the first surface, the semiconductor stacked body being provided on a side of the first surface, the reflection layer including an alloy made of a first metal and a second metal having a lower light reflectance than the first metal, and including an interior region and an exterior region provided around the interior region in plan view and having a smaller thickness than the interior region, the light reflectance at the first surface of the interior region being higher than the light reflectance at the first surface of the exterior region;
   a support substrate;
   a first bonding electrode provided between the second surface and the support substrate and including a convex portion projected toward the support substrate and a bottom portion provided around the convex portion in plan view; and
   a second bonding electrode filling a step difference of the first bonding electrode and being capable of bonding the support substrate and the first bonding electrode,
   a content ratio of the first metal in the interior region increasing toward the semiconductor stacked body, or toward the first bonding electrode, and
   the convex portion of the first bonding electrode covering the interior region.

2. The element according to claim 1, wherein
   the first metal is one of Ag, an Ag alloy, and Al, and
   the second metal is one of Au, Pt, and Pd.

3. The element according to claim 1, wherein the reflection layer is provided between the convex portion and the semiconductor stacked body, but not provided between the bottom portion and the semiconductor stacked body.

4. The element according to claim 3, further comprising:
a transparent conductive film provided between the semiconductor stacked body and the reflection layer.

5. The element according to claim 4, wherein the transparent conductive film is provided between the convex portion and the semiconductor stacked body, but not provided between the bottom portion and the semiconductor layer.

6. The element according to claim 3, wherein the first metal is Ag.

7. The element according to claim 6, wherein Ag content ratio of the interior region is 95 atomic percent or more at the first surface and decreases toward the first bonding electrode.

8. The element according to claim 6, wherein Ag content ratio of the interior region is 95 atomic percent or more at the first surface and increases toward the first bonding electrode.

9. The element according to claim 1, wherein the second bonding electrode is made of a solder material.

10. The element according to claim 9, wherein the solder material is one of AuIn, AuSn, AuGe, AuSi, and In.

* * * * *